United States Patent
Vilermo et al.

(10) Patent No.: US 10,056,876 B2
(45) Date of Patent: Aug. 21, 2018

(54) NARROWING AUDIO FILTER TRANSITION BAND

(71) Applicant: Nokia Technologies Oy, Espoo (FI)

(72) Inventors: Miikka Tapani Vilermo, Siuro (FI); Arto Juhani Lehtiniemi, Lempaala (FI); Kimmo Tapio Roimela, Tampere (FI); Ranjeeth Ravindra Shetty, Tampere (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/873,062

(22) Filed: Jan. 17, 2018

(65) Prior Publication Data

US 2018/0159491 A1 Jun. 7, 2018

Related U.S. Application Data

(62) Division of application No. 14/663,783, filed on Mar. 20, 2015, now Pat. No. 9,906,198.

(51) Int. Cl.
*H03G 5/00* (2006.01)
*H03G 5/16* (2006.01)

(52) U.S. Cl.
CPC .................................. *H03G 5/165* (2013.01)

(58) Field of Classification Search
CPC .... H04R 1/283; H04R 1/2834; H04R 1/2815; H04R 1/2819; H04R 1/2823; H04R 1/2876; H04R 3/04; H04R 3/14
USPC ................... 381/99, 349, 353, 354; 181/284
See application file for complete search history.

(56) References Cited

U.S. PATENT DOCUMENTS

| | | | | |
|---|---|---|---|---|
| 4,340,778 A | * | 7/1982 | Cowans | H04R 3/04 381/117 |
| 4,373,606 A | * | 2/1983 | Clements | H04R 1/2888 181/145 |
| 6,704,425 B1 | * | 3/2004 | Plummer | H04R 1/2819 381/339 |
| 8,018,304 B2 | * | 9/2011 | Jian | H03H 9/46 333/189 |
| 8,565,463 B2 | | 10/2013 | Saiki et al. | 381/345 |
| 2009/0103742 A1 | * | 4/2009 | Ribic | H04R 25/35 381/60 |

(Continued)

FOREIGN PATENT DOCUMENTS

EP  2 187 655 A1  5/2010
EP  2814262 A1  12/2014

(Continued)

OTHER PUBLICATIONS

"Implementation of Narrow-Band Frequency-response Masking for Efficient Narrow Transition Bank FIR Filters on FPGAs", Syed Asad Alam et al., IEEE 2011, 5 pgs.

(Continued)

*Primary Examiner* — William A Jerez Lora
(74) *Attorney, Agent, or Firm* — Harrington & Smith (57) ABSTRACT

An apparatus including a first audio filter; a first transducer connected to the first audio filter; and a first sound attenuator located relative to the first transducer to attenuate sound from the first transducer. The first audio filter includes a first transition frequency band. The first sound attenuator is configured to attenuate sound generated by the first transducer from audio signals through the first audio filter in a target frequency band, where a majority of the target frequency band is in the first transition frequency band.

20 Claims, 10 Drawing Sheets

(56) References Cited

U.S. PATENT DOCUMENTS

| | | | |
|---|---|---|---|
| 2009/0208026 A1 | 8/2009 | Nichols et al. | 381/71.4 |
| 2011/0058700 A1* | 3/2011 | Clements | H04R 1/2888 |
| | | | 381/351 |
| 2013/0133979 A1* | 5/2013 | Sheng | G10K 11/172 |
| | | | 181/294 |

FOREIGN PATENT DOCUMENTS

| | | |
|---|---|---|
| WO | WO-2013/016924 A1 | 2/2013 |
| WO | WO-2014/083326 A1 | 6/2014 |
| WO | WO-2015007221 A1 | 1/2015 |

OTHER PUBLICATIONS

"Designed Metasurface Is a Thin, Near Perfect Acoustic Absorber", Neomatica, http://www.neomatica.com/2014/08/27/designed-metasurface-thin-near-perfect-acoustic-absorber/; Aug. 2014, 15 pgs.

"Active control of acoustic reflection, absorption and transmission using thin panel speakers", H. Zhu, et al., J. Acoust. Soc. Am. 113(2), Feb. 2003, http://ancsystems.narod.ru/jasa/852_1.pdf; 19 pgs.

"The Virtual Loudspeaker Cabinet", J. R. Wright, Convention Paper 5421, Sep. 2001, 8 pgs.

"Who We Are—Acoustic Fields", http://www.acousticfields.com/who-we-are/; Acoustic Fields, 2014, 7 pgs.

Designing Low Pass FIR Filers, MATLAB & Simulink Example, http://se.mathworks.com/help/dsp/examples/designing-low-pass-fir-filters.html; 16 pgs.

* cited by examiner

NARROWING AUDIO FILTER TRANSITION BAND

CROSS REFERENCE TO RELATED APPLICATION

This is a divisional patent application of copending application Ser. No. 14/663,783 filed Mar. 20, 2015 which is hereby incorporated by reference in its entirety.

BACKGROUND

Technical Field

The exemplary and non-limiting embodiments relate generally to audio and, more particularly, to narrowing an audio filter transition band.

Brief Description of Prior Developments

Audio filters, such as in a crossover, are known. Audio filters which have wide transition bands do not provide as good a quality sound as compared to audio filters which have narrower transition bands. However, making analog or digital filters with narrow transition bands, while still providing good quality sound, is difficult and expensive.

SUMMARY

The following summary is merely intended to be exemplary. The summary is not intended to limit the scope of the claims.

In accordance with one aspect, an example is provided in an apparatus comprising a first audio filter, where the first audio filter comprises a first transition frequency band; a first transducer connected to the first audio filter; and a first sound attenuator located relative to the first transducer to attenuate sound from the first transducer, where the first sound attenuator is configured to attenuate sound generated by the first transducer from audio signals through the first audio filter in a target frequency band, where a majority of the target frequency band is in the first transition frequency band.

In accordance with another aspect, an example method comprises providing a first audio filter, where the first audio filter comprises a first transition frequency band; connecting a first transducer to the first audio filter; and locating a first sound attenuator relative to the first transducer to attenuate sound from the first transducer, where the first sound attenuator is configured to attenuate sound generated by the first transducer from audio signals through the first audio filter in a target frequency band, where a majority of the target frequency band is in the transition frequency band.

In accordance with another aspect, an example method comprises determining at least one desired pass frequency to be provided with a first audio filter connected to a first transducer, where the first audio filter comprises a first transition frequency band relative to the at least one desired pass frequency; and determining a first sound attenuator to be located proximate the first transducer to attenuate sound from the first transducer, where the first sound attenuator is selected for location relative to the first transducer to attenuate sound from the first transducer which is generated from audio signals through the first audio filter in a target frequency band, where a majority of the target frequency band is in the transition frequency band to provide an output from the first transducer having a narrowed frequency range from the attenuation in the transition frequency band.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
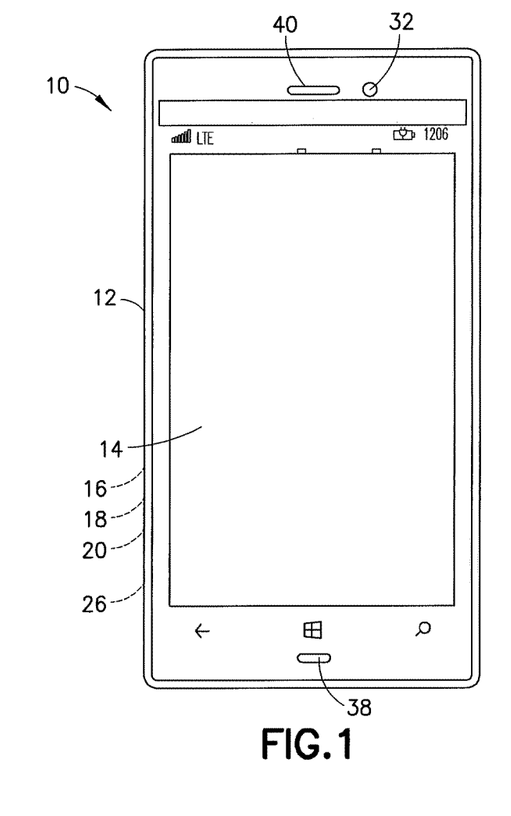
FIG. 1 is a front view of an example embodiment of an apparatus comprising features as described herein.

Referring to FIG. 1, there is shown a front view of an apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

The apparatus 10 may be a hand-held portable apparatus, such as a communications device which includes a telephone application for example. In the example shown the apparatus 10 is a smartphone which includes a camera and a camera application. The apparatus 10 may additionally or alternatively comprise an Internet browser application, a video recorder application, a music player and recorder application, an email application, a navigation application, a gaming application, and/or any other suitable electronic device application. In an alternate example embodiment the apparatus might not be a smartphone. For example, the apparatus might be a video camera, a hand-held game or game remote, a tablet computer, or any other suitable hand-held electronic device.

Figure 2:
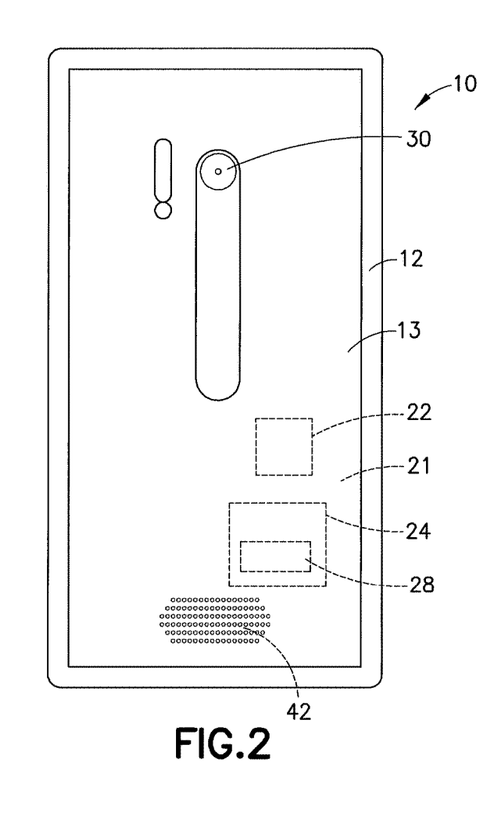
FIG. 2 is a rear view of the apparatus shown in FIG. 1.
Figure 3:
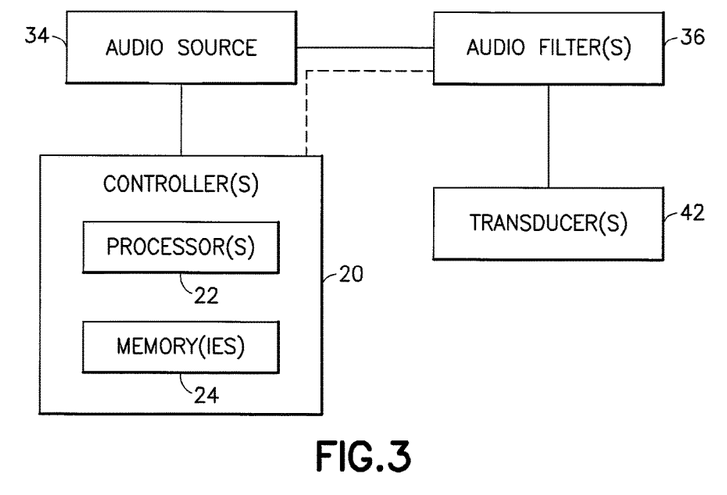
FIG. 3 is a schematic diagram illustrating some of the components of the apparatus shown in FIGS. 1-2.

Referring also to FIGS. 2-3, the apparatus 10, in this example embodiment, comprises a housing 12, a touch-screen 14, a receiver 16, a transmitter 18, a controller 20, a rechargeable battery 26, a first camera 30 and a second camera 32. However, all of these features are not necessary to implement the features described below. The controller 20 may include at least one processor 22, at least one memory 24, and software 28. The electronic circuitry inside the housing 12 may comprise at least one printed wiring board (PWB) 21 having components such as the controller 20 thereon. The receiver 16 and transmitter 18 form a primary communications system to allow the apparatus 10 to communicate with a wireless telephone system, such as a mobile telephone base station for example.

The apparatus 10 includes a sound transducer provided as a microphone 38. In an alternate example the apparatus may comprise more than one microphone. In one type of example embodiment the apparatus might not comprise a microphone. The apparatus 10 includes a sound transducer provided as an earpiece 40, and sound transducers provided as a speaker 42. More than one speaker may be provided. As seen in FIG. 3, the apparatus 10 comprises an audio source 34 connected to the controller 20. The audio source may comprise a MP3 player, a CD player, etc. for example. Other audio sources, for example, may comprise audio from a transmission received by the receiver 16 or audio in a music or video recording stored in the memory(ies) 24.

Figure 4:
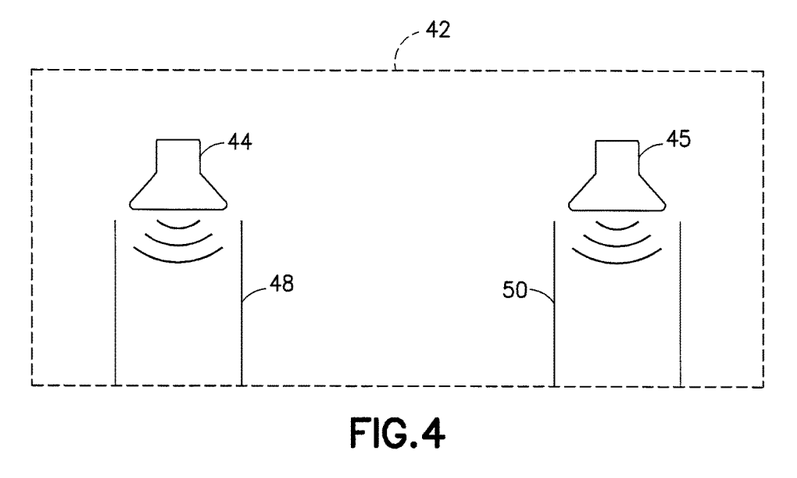
FIG. 4 is a schematic diagram illustrating components of the speaker shown in FIGS. 2-3.

Referring also to FIG. 4, the speaker 42 in this example comprises two transducers 44, 45. In this example the first transducer 44 is a woofer (designed to produce low frequency sounds) and the second transducer 45 is a tweeter (designed to produce high audio frequencies). In an alternate example the speaker might comprise more than two transducers, such as having an additional squawker (mid-range driver). As seen in FIG. 3, part of the electronics on the PWB 21 includes at least one audio filter 36 which connects the audio source 34 to the transducers 44, 45 of the speaker 42. The audio filter 36 may comprise an audio crossover for example.

Most individual transducers are incapable of covering the entire audio spectrum from low frequencies to high frequencies with acceptable relative volume and absence of distortion. Thus, most Hi-Fi speaker systems use a combination of multiple transducers; each catering to a different frequency band. Crossovers split the audio signal into separate frequency bands that can be separately routed to transducers optimized for those bands. Active crossovers come in both digital and analog varieties. Digital active crossovers often include additional signal processing, such as limiting, delay, and equalization.

Features as described herein relate generally to audio filters, filter design, sound absorbers (such as metamaterials for example), and microphone and loudspeaker design. A transition band is a band of frequencies between a cutoff frequency and a pass frequency. Making analog or digital filters with a narrow transition band is difficult. There are many reasons for this including, for example, computational complexity, delay, component cost, component tolerances etc. Sometimes, products are designed so that the shape of the product causes acoustic characteristics that make the product more sensitive to some frequencies than to others. These characteristic typically have a very wide transition band.

Figure 5:
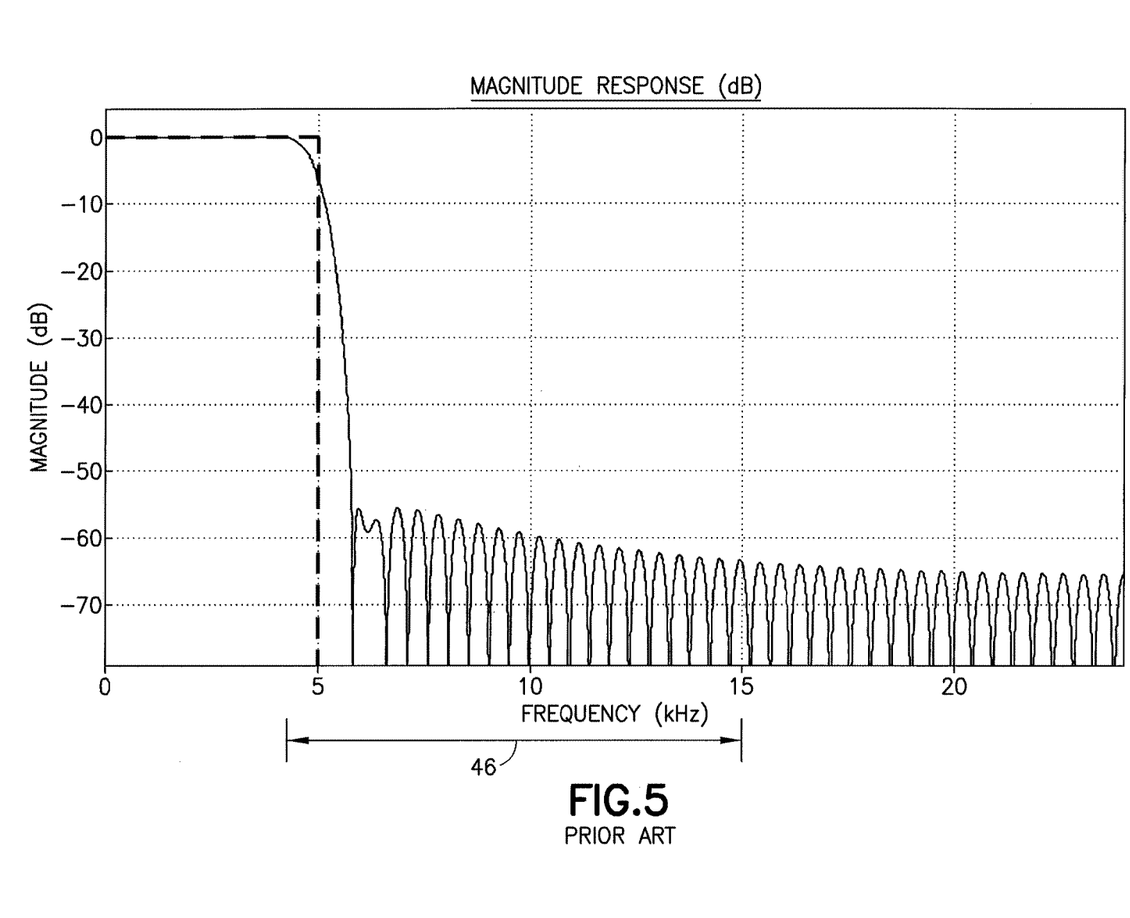
FIG. 5 is a diagram illustrating characteristics of a conventional low pass filter.
Figure 6:
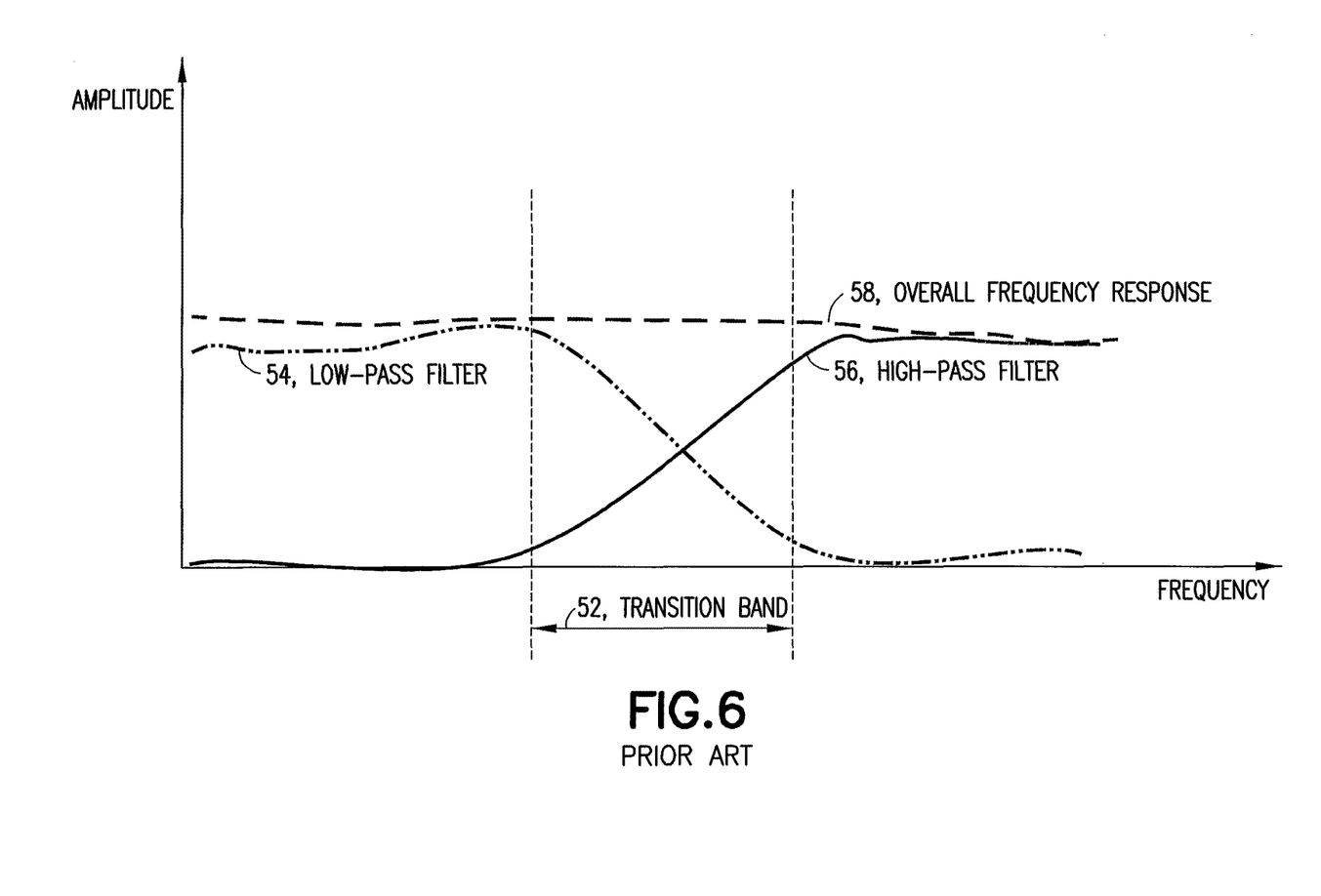
FIG. 6 is a diagram illustrating a conventional transition band for a low-pass filter and high-pass filter.
Figure 7:
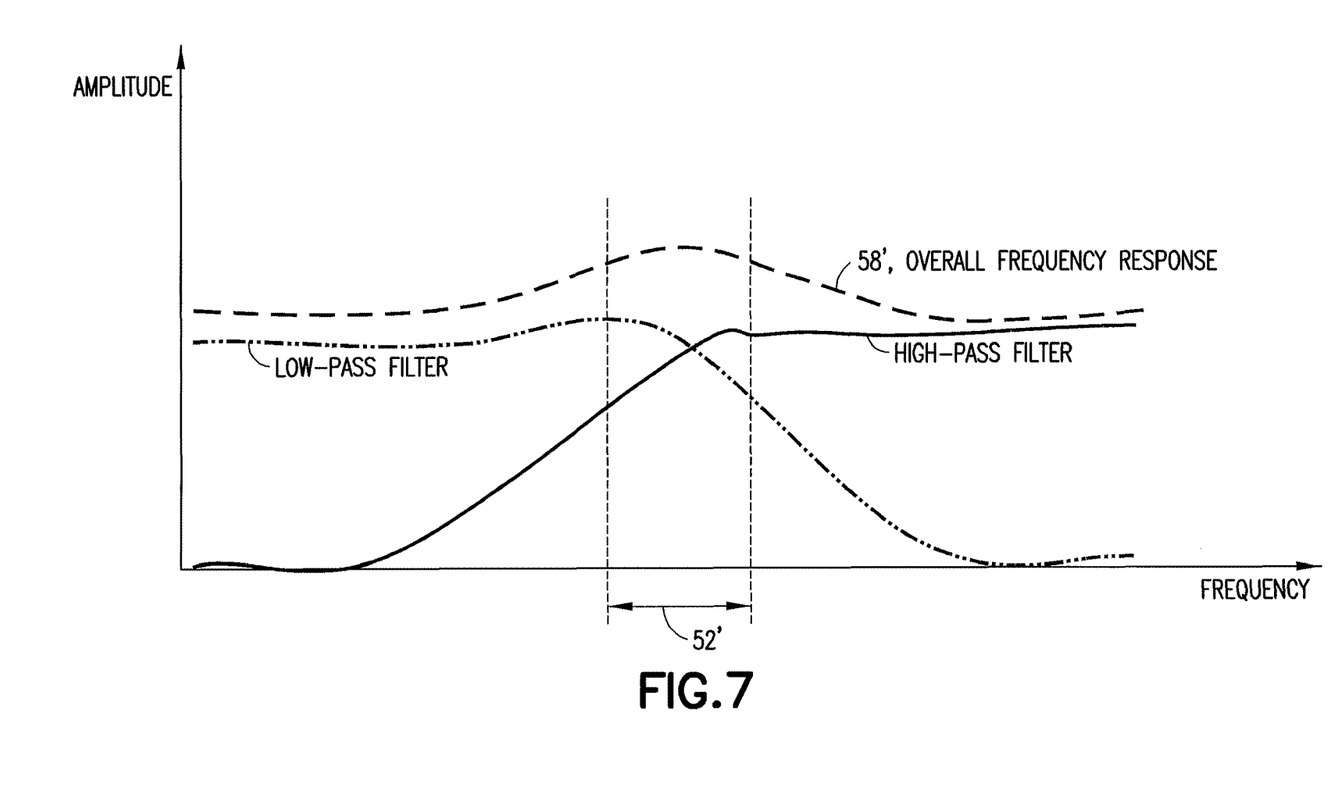
FIG. 7 illustrates an increase in overall frequency response above unity for moving cutoffs closer to one another for the low-pass filter and high-pass filter shown in FIG. 6.

FIG. 5 presents an example of a frequency response with a typical low pass filter. Despite a high order (300) that makes the filter complex, the transition region 46 is quite wide. Referring also to FIG. 6, this design illustrates a conventional transition band 52 in an amplitude versus frequency chart in a crossover for a low-pass filter 54 and a high pass filter 56, and their overall frequency response 58. As can be seen, the transition band 52 for the crossover filter is wide. If one tried to make the transition band narrower 52' by merely moving the filter cut-off frequencies closer to each other as illustrated in FIG. 7, the overall frequency response 58' raises above unity. This is not acceptable for sound reproduction.

With features as described herein, a combination of a filter (digital or analog or acoustic) and absorbing metamaterials (or an active acoustic absorber) makes it possible to provide a narrower transition band in the filtering process without the overall frequency response being raised above unity. Use of sound attenuating metamaterials (or an active acoustic attenuator) may be taken into account in the filter design process. Thus, a combination of a digital/analog/acoustic filter and absorbing metamaterials makes possible more narrow transition bands with the filters. The filter may be designed with relaxed transition band characteristics, and the transitions bands may be made narrower by using one or more different patches of metamaterial to attenuated sound at the different transition bands. A transition region for a filter may be made more narrow by using metamaterial tuned to frequencies in the transition region in the acoustic environment where the filter is used.

Metamaterials are artificial materials engineered to have properties that have not yet been found in nature. They are assemblies of multiple individual elements fashioned from conventional materials such as metals or plastics, but the materials are usually constructed into repeating patterns, often with microscopic structures. Metamaterials derive their properties not from the compositional properties of the base materials, but from their exactingly-designed structures. Their precise shape, geometry, size, orientation and arrangement can affect waves of sound in a manner not observed in natural materials. These metamaterials achieve desired effects by incorporating structural elements of sub-wavelength sizes, i.e. features that are actually smaller than the wavelength of the waves they affect.

Metamaterials textured with nanoscale wrinkles may be used to control sound, such as changing a material's ultra-sound resolution. Uses include sound suppression. The materials can be made through a high-precision, multi-layer deposition process. The thickness of each layer can be controlled within a fraction of a wavelength.

Figure 8:
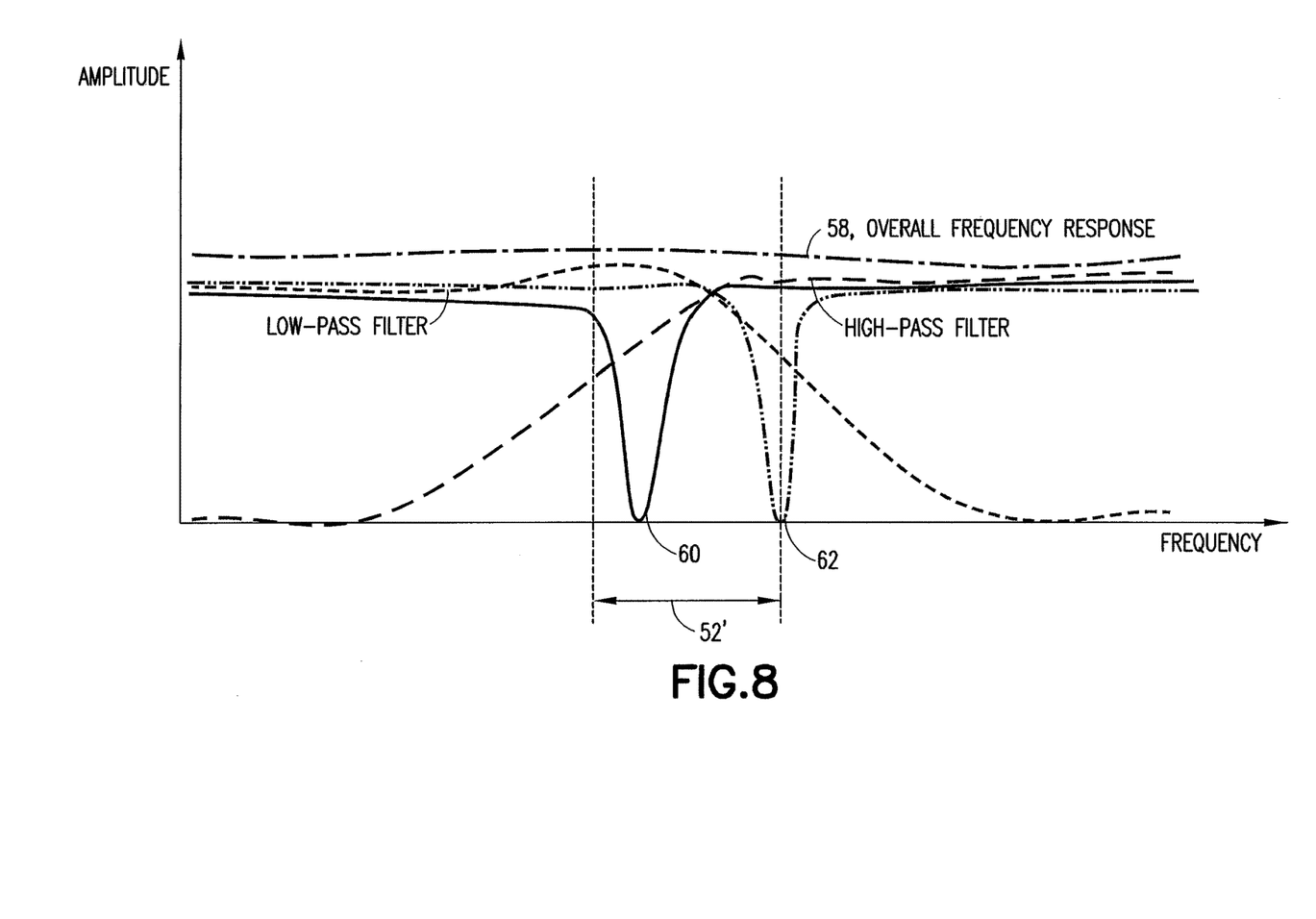
FIG. 8 is a diagram, similar to FIG. 7, for the apparatus shown in FIG. 4, but illustrating a narrowed transition band without increase in overall frequency response above unity.

Referring back to FIG. 4, in this example the speaker 42 is provided with a first sound attenuator 48 at the first transducer 44 and a second sound attenuator 50 at the second transducer 45. The audio filter 36 comprise a low-pass filter and a high-pass filter having the characteristics shown in FIG. 7. Audio signals from the audio source 34 for the woofer 44 are supplied through the low-pass filter, and audio signals from the audio source 34 for the tweeter 46 are supplied through the high-pass filter. However, with use of the attenuators 48, 50, overall frequency response can be kept substantially at or lower than unity as seen in FIG. 8.

The first sound attenuator 48 is configured to attenuate sound from the woofer 44 generated from frequencies in the transition band 52'. The second sound attenuator 50 is configured to attenuate sound from the tweeter 46 generated from frequencies in the transition band 52'. As seen in FIG. 8, the first sound attenuator 48 cause a drop in amplitude for its corresponding frequencies as illustrated by 60. Likewise, the second sound attenuator 50 cause a drop in amplitude for its corresponding frequencies as illustrated by 62. With the sound attenuators 48, 50, the transition band 52' may be made narrower by moving the filter cut-off frequencies closer to each other similar to that shown in FIG. 7, but without the overall frequency response 58 being raised significantly or noticeably above unity.

The metamaterial attenuates sound is a very narrow frequency region. Sometimes the transition bands might be so wide that, in order to provide attenuation to most of the transition band, there may be a need to use several different patches of metamaterial each tuned to a different frequency so that the frequencies of the patches cover the desired attenuation frequency region. An example of this is shown with regard to FIGS. 9-10.

Figure 9:
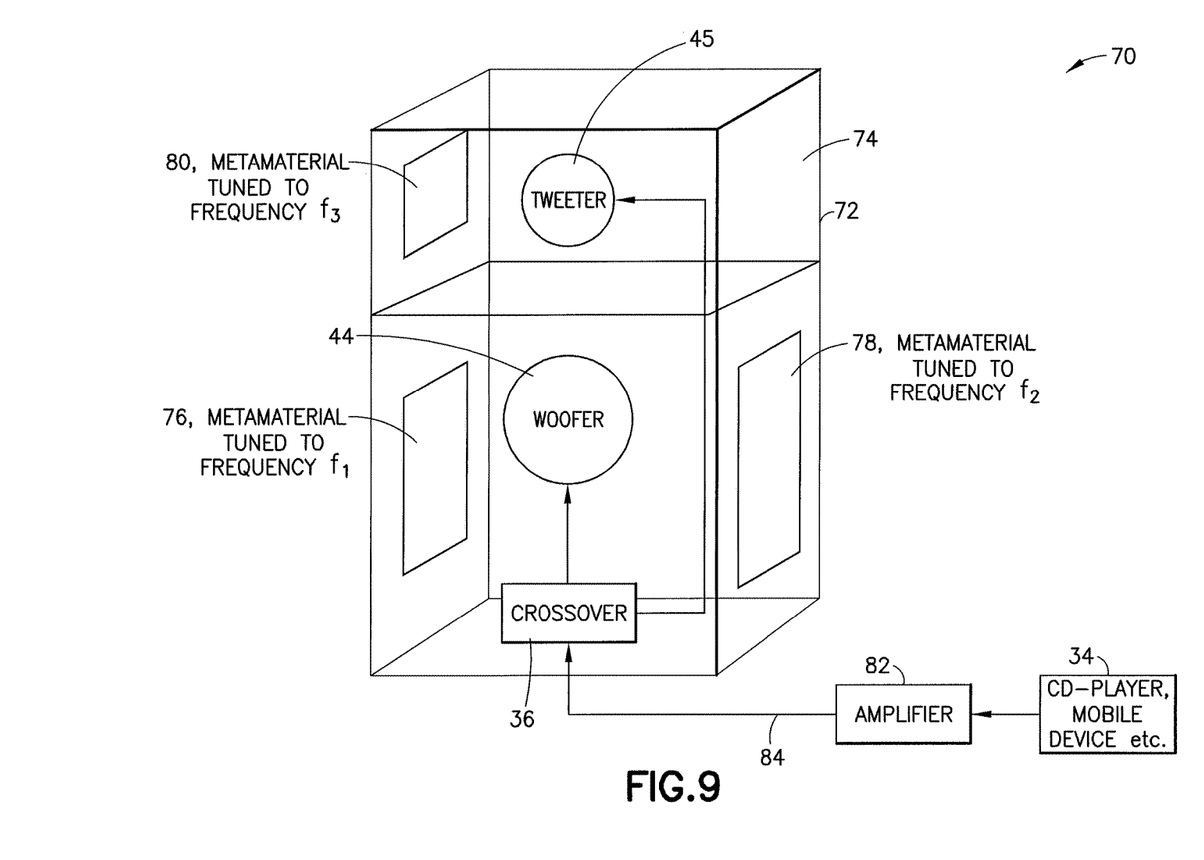
FIG. 9 is an example of an alternate example embodiment.
Figure 10:
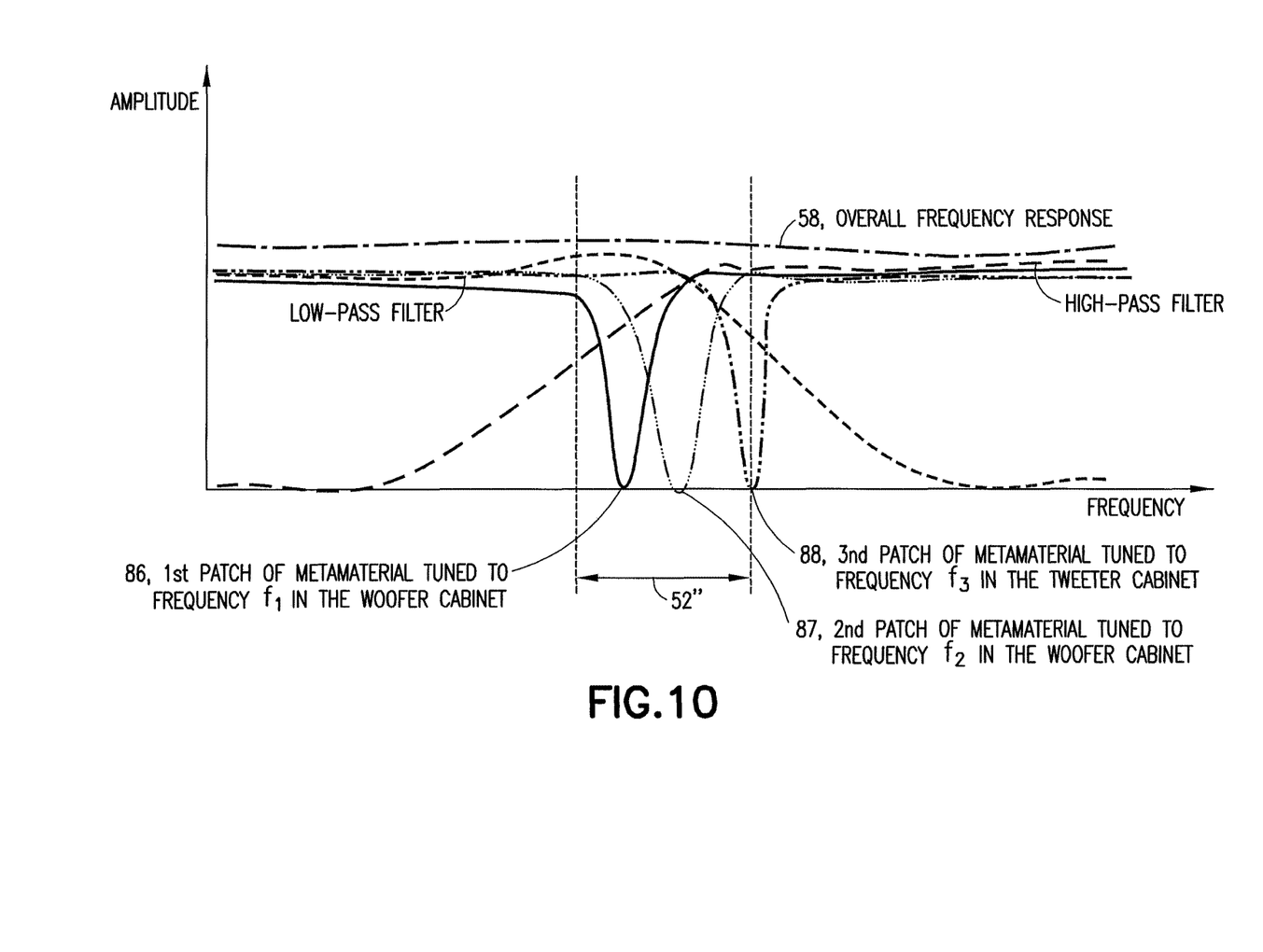
FIG. 10 is a diagram similar to FIG. 8, but for the example shown in FIG. 9.

In the example shown in FIGS. 9-10, a speaker 70 is shown with a woofer box or cabinet 72 adjacent a tweeter box or cabinet 74. The woofer 44 is provided at the woofer cabinet 72. The tweeter 46 is provided at the tweeter cabinet 74. A first patch of metamaterial 76 and a second patch of metamaterial 78 are located in the woofer cabinet 72. A third patch of metamaterial 80 is located in the tweeter cabinet 74. A crossover 36 provides audio signals to the woofer 44 and the tweeter 46 from an amplifier 82 and audio source 34. The crossover 36 has a low pass filter and a high pass filter to provide respective signals to the woofer and tweeter from the input signal 84. The impact of the patches 76, 78, 80 of metamaterials, as illustrated by lines 86, 87, 88 in FIG. 10, allow the crossover 36 to be designed with the cutoffs for the low-pass filter and the high-pass filter to be closer to each other without increasing the overall frequency response 58 above unity. The transition band 52" may, thus, be narrower than without the metamaterials. This example illustrates that more than one patch of metamaterial, tuned to at least partially different frequencies, can be provided for a single transducer.

Figure 11:
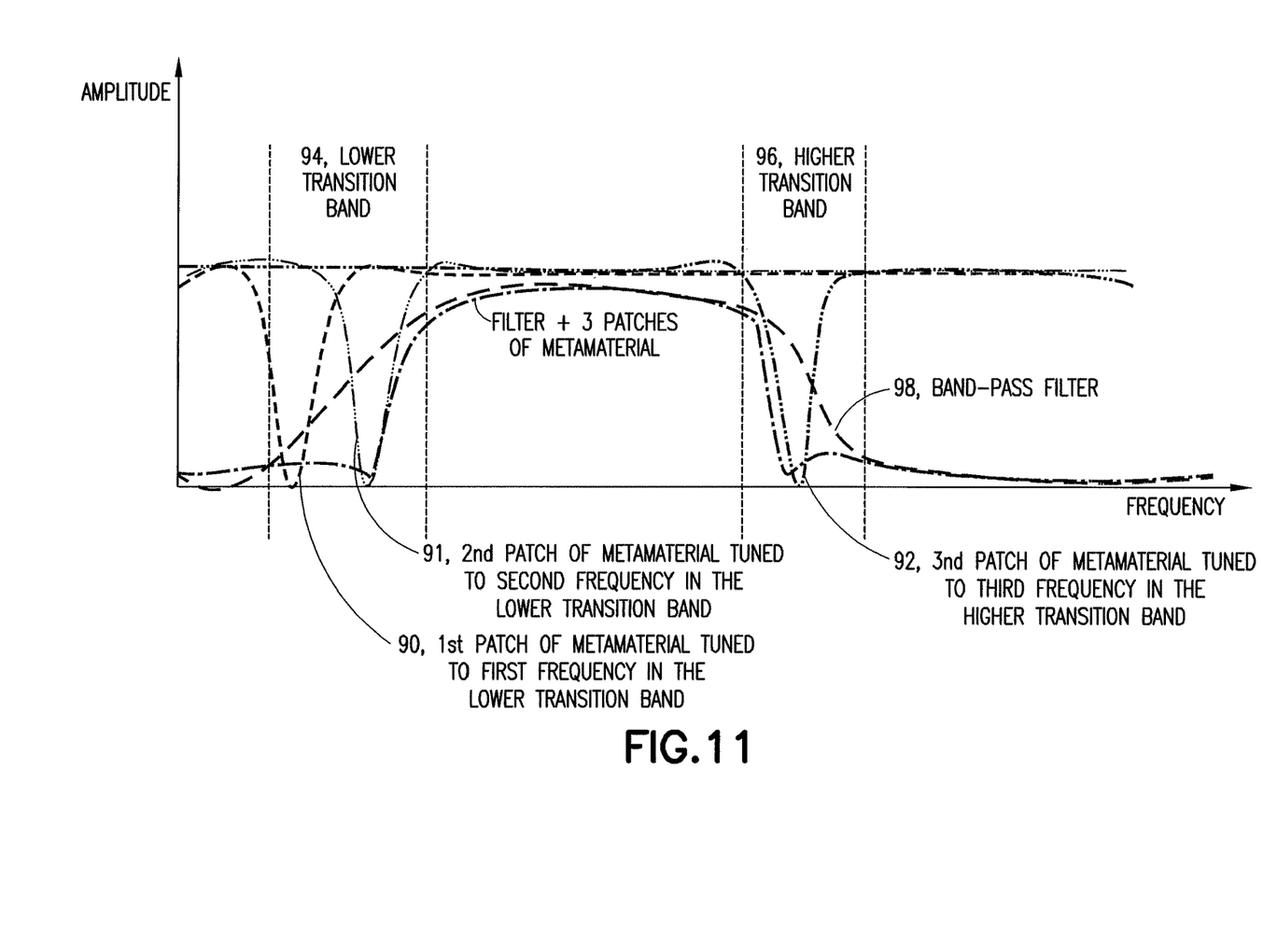
FIG. 11 is a diagram similar to FIGS. 8 and 10, but for another alternate example.

Referring also to FIG. 11, features as described herein may be used with a band pass filter. In this example three sound attenuators are provided with three different respective bands of frequency tunings as indicated by 90, 91 and 92. The first sound attenuator comprises a first patch of metamaterial tuned to a first frequency band in a lower transition band 94, the second sound attenuator comprises a second patch of metamaterial tuned to a second different frequency band in the lower transition band, and the third sound attenuator comprises a third patch of metamaterial tuned to a third frequency band in a higher transition band 96. With the band pass filter response 98, and the metamaterials effect on the sound output from the transducer, the transition bands 94, 96 can be narrowed without the overall frequency response being raised above unity. Thus, when a band pass filter is used, patches of metamaterial tuned to two different frequency transition regions, may be used; one or more at the lower transition region and one or more at the higher transition region. However, with low-pass and high-pass filters only one transition region is needed to be addressed.

The amount of metamaterial (size of the area) can be used to control the level of attenuation. The use of metamaterials allows the change of the filter design. Features as described herein are not limited to a speaker. Features as described herein may be used with microphones as the transducers for example.

Although the examples described above have included a band-pass filter, a low-pass filter and a high-pass filter, features as described herein may be used with any type of filter which is not an all-pass filter, such as a notch filter for example. It does not matter whether the filters are notch, band-pass, low-pass etc. The interesting thing takes place in the transition band which all filter have (except for all-pass filters). In the transition band, sound may be attenuated from one or more transducers. The signals in the transition band is attenuated by filters. The transition band definition varies. In one example, it could be a region where a filter attenuates the signal between 3 dB and 60 dB. In the pass band, the signal may be attenuated less than 3 dB and in the stop band the signal may be attenuated more than 60 dB. The metamaterial may be used to make the transition bands more narrow. In a way, the metamaterial is an additional filter that helps the signal hit the 60 dB attenuation faster.

An example apparatus comprises a first audio filter, where the first audio filter comprises a first transition frequency band between a cutoff frequency and a pass frequency; a first transducer connected to the first audio filter; and a first sound attenuator located relative to the first transducer to attenuate sound from the first transducer, where the first sound attenuator is configured to attenuate sound generated by the first transducer from audio signals through the first audio filter in a target frequency band, where a majority of the target frequency band is in the first transition frequency band. The material may attenuate sounds in the region of the filter's operating band, and there may be some attenuation slightly outside of the filter's operating band. Thus, the term 'substantially' is used. Such attenuation outside of the filter band is considered to be small and unintentional.

The apparatus may further comprise a second different sound attenuator located relative to the first transducer to attenuate sound from the first transducer, where the second sound attenuator is configured to substantially only attenuate sound generated by the first transducer from audio signals through the first audio filter in the first transition frequency band. The first sound attenuator may comprise metamaterial tuned to attenuate sound from the first transducer from audio signals through the first audio filter substantially only in the first transition frequency band. The first audio filter may comprise a low pass filter and the apparatus may further comprise a second transducer, a second audio filter comprising a high pass filter, and a second sound attenuator located relative to the second transducer to attenuate sound from the second transducer, where the second sound attenuator is configured to substantially only attenuate sound generated by the second transducer from audio signals through the high pass filter in a second transition frequency band, where the second transition band substantially overlaps the first transition frequency band. The first audio filter may be a band pass filter which comprises a second transition frequency band between a second cutoff frequency and the pass frequency, and the apparatus further comprises: a second transducer connected to the first audio filter; and a second sound attenuator located relative to the second transducer to attenuate sound from the second transducer, where the second sound attenuator is configured to substantially only attenuate sound generated by the second transducer from audio signals through the band pass filter in the second transition frequency band. The first sound attenuator may comprise a first metamaterial tuned to attenuate sound from the first transducer from audio signals through the band pass filter substantially only in the first transition frequency band, and the second sound attenuator comprises a second metamaterial tuned to attenuate sound from the second transducer from audio signals through the band pass filter substantially only in the second transition frequency band. The apparatus may further comprise a third different sound attenuator located relative to the first transducer to attenuate sound from the first transducer, where the third sound attenuator is configured to substantially only attenuate sound generated by the first transducer from audio signals through the band pass filter in the first transition frequency band. The first sound attenuator may be configured to flatten the frequency response and/or sharpening a roll off rate (higher order roll off) of a speaker system comprising the first transducer. In some respects, the metamaterial may be considered an optimizer rather than an attenuator (or as well as acting as an attenuator).

Figure 12:
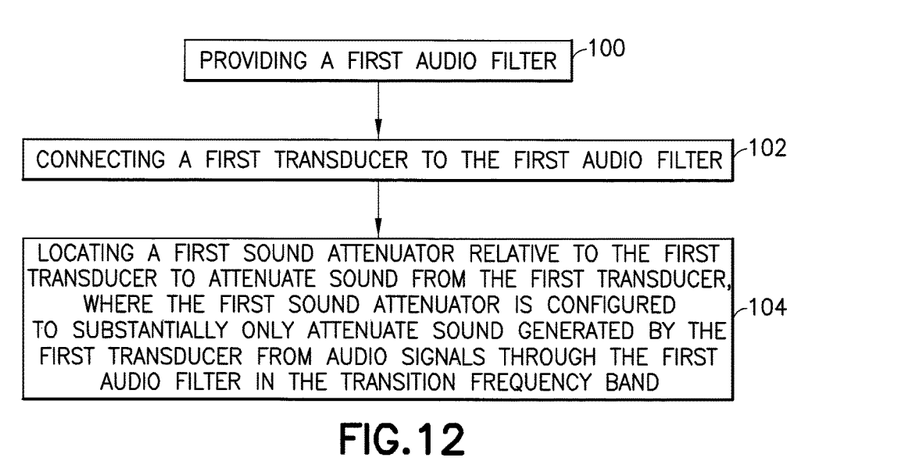
FIG. 12 is a diagram illustrating an example method.

Referring also to FIG. 12, an example method may comprise providing a first audio filter as indicated by block 100, where the first audio filter comprises a first transition frequency band between a cutoff frequency and a pass frequency; connecting a first transducer to the first audio filter as indicated by block 102; and, as indicated by block 104, locating a first sound attenuator relative to the first transducer to attenuate sound from the first transducer, where the first sound attenuator is configured to attenuate sound generated by the first transducer from audio signals through the first audio filter in a target frequency band, where a majority of the target frequency band is in the transition frequency band.

The method may further comprise providing a second different sound attenuator located relative to the first transducer to attenuate sound from the first transducer, where the second sound attenuator is configured to substantially only attenuate sound generated by the first transducer from audio signals through the first audio filter in the first transition frequency band. The first sound attenuator may comprise metamaterial tuned to attenuate sound from the first transducer from audio signals through the first audio filter substantially only in the first transition frequency band. The first audio filter may be a low pass filter and the method may further comprise providing a second transducer, a second audio filter comprising a high pass filter, and a second sound attenuator located relative to the second transducer to attenuate sound from the second transducer, where the second sound attenuator is configured to substantially only attenuate sound generated by the second transducer from audio signals through the high pass filter in a second transition frequency band, where the second transition band substantially overlaps the first transition frequency band. The first audio filter may be a band pass filter which comprises a second transition frequency band between a second cutoff frequency and the pass frequency, and the method may further comprise: providing a second transducer connected to the first audio filter; and providing a second sound attenuator located relative to the second transducer to attenuate sound from the second transducer, where the second sound attenuator is configured to substantially only attenuate sound generated by the second transducer from audio signals through the band pass filter in the second transition frequency band.

The first sound attenuator may comprise a first metamaterial tuned to attenuate sound from the first transducer from audio signals through the band pass filter substantially only in the first transition frequency band, and the second sound attenuator comprises a second metamaterial tuned to attenuate sound from the second transducer from audio signals through the band pass filter substantially only in the second transition frequency band. The method may further comprise providing a third different sound attenuator located relative to the first transducer to attenuate sound from the first transducer, where the third sound attenuator is configured to substantially only attenuate sound generated by the first transducer from audio signals through the band pass filter in the first transition frequency band.

Figure 13:
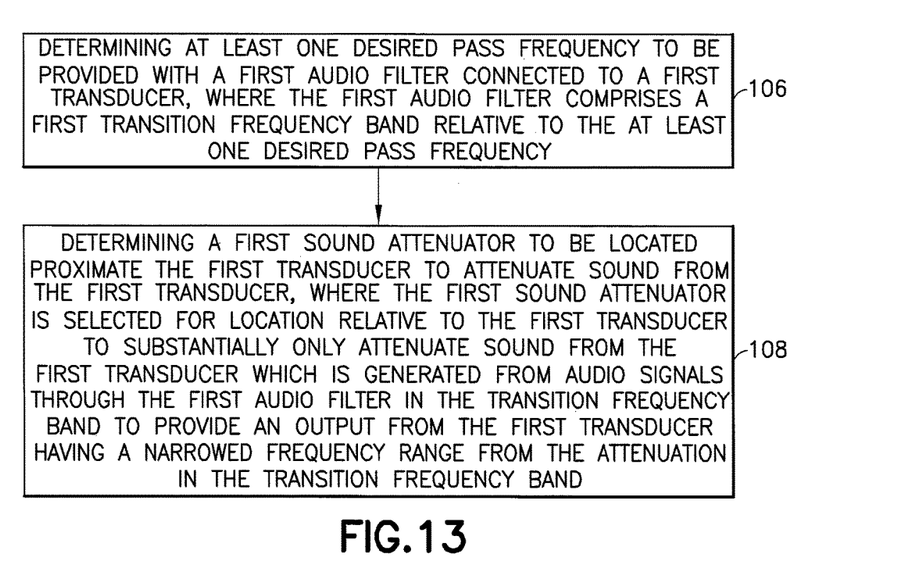
FIG. 13 is a diagram illustrating an example method.

Referring also to FIG. 13, an example method may comprise determining, as indicated by block 106, at least one desired pass frequency to be provided with a first audio filter connected to a first transducer, where the first audio filter comprises a first transition frequency band relative to the at least one desired pass frequency; and determining, as indicated by block 108, a first sound attenuator to be located proximate the first transducer to attenuate sound from the first transducer, where the first sound attenuator is selected for location relative to the first transducer to substantially only attenuate sound from the first transducer which is generated from audio signals through the first audio filter in the transition frequency band to provide an output from the first transducer having a narrowed frequency range from the attenuation in the transition frequency band.

The method may further comprise determining at least one desired pass frequency to be provided with a second audio filter connected to a second transducer, where the second audio filter comprises a second transition frequency band which substantially overlaps the first transition frequency band, and determining a second sound attenuator to be located proximate the second transducer to attenuate sound from the second transducer, where the second sound attenuator is selected for location relative to the second transducer to substantially only attenuate sound from the second transducer which is generated from audio signals through the second audio filter in the second transition frequency band to provide an output from the second transducer having a narrowed frequency range from the attenuation in the second transition frequency band. The first audio filter may be a band pass filter which comprises a lower transition band, as the first transition frequency band, and a higher transition band. The first audio filter may be a band pass filter which comprises a higher transition band, as the first transition frequency band, and a lower transition band.

An example embodiment may comprise means for providing a first audio filter, where the first audio filter comprises a first transition frequency band between a cutoff frequency and a pass frequency; means for connecting a first transducer to the first audio filter; and means for locating a first sound attenuator relative to the first transducer to attenuate sound from the first transducer, where the first sound attenuator is configured to attenuate sound generated by the first transducer from audio signals through the first audio filter in a target frequency band, where a majority of the target frequency band is in the transition frequency band.

An example embodiment may comprise means for determining at least one desired pass frequency to be provided with a first audio filter connected to a first transducer, where the first audio filter comprises a first transition frequency band relative to the at least one desired pass frequency; and means for determining a first sound attenuator to be located proximate the first transducer to attenuate sound from the first transducer, where the first sound attenuator is selected for location relative to the first transducer to attenuate sound from the first transducer which is generated from audio signals through the first audio filter in a target frequency band, where a majority of the target frequency band is in the transition frequency band to provide an output from the first transducer having a narrowed frequency range from the attenuation in the transition frequency band. The means may comprise a computer with a processor, a memory and software code for the determinings and an output for communicating the determinings to a user to design and build an apparatus as described above for example.

In a transition band between two filters an example may have sound from two transducers; each sound through its own filter. The two sounds overlap each other. An attenuator in the transition band could attenuate both sounds if it is in a location where both sounds are present, such as outside a speaker cavity for example. However, if an example has a two transducer element speaker, where each element is in its own cavity, then the attenuator in one cavity would mostly effect the sound from that element. In one example there may be a multiple element speaker and two attenuators tuned to different frequencies were used inside the same element cavity. Two attenuators may be used to make the attenuation work at a wider frequency range. In another example one attenuator may be used to attenuate sounds from one element and a second attenuator may be used to attenuate sounds from a second element. For a frequency response "hump", the hump could additionally be attenuated by also putting an attenuator outside both speaker cavities so that the attenuator would affect sound from both elements.

With features as described herein, material responses may be tuned at particular frequency regions during which these materials cause attenuation effects. An example may provide a band-pass frequency response with sharper upper and lower roll-off, where unwanted frequencies are attenuated more significantly and the chance of unwanted frequency audibility becomes very small. Such a band-pass response represent a frequency response of a speaker system regardless of whether the speaker system comprises a single speaker or multiple speakers. In a multiple speaker system, such as with a woofer and a tweeter, a cross over network may be used. Features as described herein can help overall playback response from multiple speakers where cross-over cutoff frequency region can be optimized further.

Features as described herein are applicable to a speaker system having a single speaker where the material can be used to optimise the frequency response. This is different from use of activated carbon for example, because the effect is a local effect in the frequency response and the material is acting as an additional filter. Features may be used in any speaker system including portable device speakers, hi-fi industry, etc. Such material can be used for speaker systems with or without activated carbon in speaker cavities. The attenuation material(s) as described herein may be tuned for a target frequency region(s).

The location of the attenuator relative to the sound transducer may be selected to produce a desired effect, and thus influence how the audio signals are delivered to the sound transducer. In some example embodiments the location of the attenuator can be determined for the desired effect. In some example embodiments the position of the attenuator is not a random position, and is particularly identified/designed in order to enable the material functions in the desired manner. Any suitable means could be used to locate the sound attenuator(s) relative to the sound transducer(s) including, for example, use of glue to attach the sound transducer(s) to a frame or cabinet or inside an audio channel, adhesive tape, welding techniques or other techniques. This can help insure the sound transducer(s) stay at a desired target location relative to the sound coming from the transducer(s).

With features as described in some of the example embodiment above, the transducer is driven with audio signals, where the filter is a electrical/digital filter which attenuates desired frequencies before the transducer. The signals to the audio filter are in the electrical/digital domain. The material of the sound attenuator/optimizer is a mechanical component that provides attenuation in the transition band in the acoustic domain; after the sound is generated by the transducer. Both the filter and the material of the sound attenuator/optimizer function in the transition band, but in different domains (i.e. the domain is the acoustic domain in the case of the material).

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
   audio filter circuitry;
   a first transducer coupled to the audio filter circuitry;
   a second transducer coupled to the audio filter circuitry;
   a first sound attenuator located and tuned relative to the first transducer to attenuate first sound from the first transducer, where the first sound attenuator is an absorber configured to attenuate sound in a first attenuation band when the first sound is generated by the first transducer from audio signals through the audio filter circuitry, where the first attenuation band is at least partially in a transition band of the audio filter circuitry; and
   a second sound attenuator located and tuned relative to the second transducer to attenuate second sound from the second transducer, where the second sound attenuator is an absorber configured to attenuate sound in an at least partially different second attenuation band when the second sound is generated by the second transducer from the audio signals through the audio filter circuitry, where the second attenuation band is at least partially in the transition band of the audio filter circuitry.

2. An apparatus as in claim 1 where the audio circuitry comprises a low-pass filter and a high-pass filter, where the low-pass filter comprises a first frequency transition band, where the high-pass filter comprises a second frequency transition band, and where the first and second frequency transition bands at least partially overlap.

3. An apparatus as in claim 2 where the first attenuation band forms a first target frequency band located in the overlap of the first and second frequency transition bands.

4. An apparatus as in claim 3 where the second attenuation band forms a second target frequency band located in the overlap of the first and second frequency transition bands.

5. An apparatus as in claim 4 where the second attenuation band is located at an end of the second frequency transition band of the high-pass filter partially in the second frequency transition band and partially out of the second frequency transition band of the high-pass filter.

6. An apparatus as in claim 3 where the first attenuation band is located only in the transition band of the audio filter circuitry.

7. An apparatus as in claim 1 where the first attenuation band is located partially out of the transition band of the audio filter circuitry.

8. An apparatus as in claim 1 where the first sound attenuator comprises metamaterial tuned to attenuate sound from the first transducer from the audio signals through the audio filter circuitry in the first attenuation band.

9. An apparatus as in claim 8 where the second sound attenuator comprises metamaterial tuned to attenuate sound from the second transducer from the audio signals through the audio filter circuitry in the second attenuation band.

10. An apparatus as in claim 8 further comprising a third sound attenuator comprising metamaterial tuned to attenuate sound from the first transducer from the audio signals through the audio filter circuitry in an at least partially different third attenuation band.

11. A method comprising:
    providing audio filter circuitry;
    coupling a first transducer to the audio filter circuitry;
    coupling a second transducer to the audio filter circuitry;

locating a first sound attenuator relative to the first transducer to attenuate first sound from the first transducer, where the first sound attenuator is an absorber configured to attenuate sound in a first frequency transition band of the audio filter circuitry in a first attenuation band of the first sound attenuator when the first sound is generated by the first transducer from audio signals through the audio filter circuitry; and locating a second sound attenuator relative to the second transducer to attenuate second sound from the second transducer, where the second sound attenuator is an absorber configured to attenuate sound in a second frequency transition band of the audio filter circuitry in a second attenuation band of the second sound attenuator when the second sound is generated by the second transducer from the audio signals through the audio filter circuitry.

12. An apparatus comprising:

audio circuitry comprising a low-pass filter and a high-pass filter, where the low-pass filter comprises a first frequency transition band, where the high-pass filter comprises a second frequency transition band, and where the first and second frequency transition bands at least partially overlap to form a transition band of the audio circuitry;

a first transducer coupled to the audio circuitry; and a first sound attenuator located and tuned relative to the first transducer to attenuate sound from the first transducer, where the first sound attenuator is an absorber configured to attenuate the sound in an attenuation frequency band only in the overlap of the first and second frequency transition bands.

13. An apparatus as in claim 12 further comprising a second sound attenuator located and tuned relative to the first transducer to attenuate sound from the first transducer, where the second sound attenuator is an absorber configured to attenuate the sound in a second attenuation frequency band which is located either:

only in the overlap of the first and second frequency transition bands, or both partially in the overlap of the first and second frequency transition bands and partially out of the overlap of the first and second frequency transition bands.

14. An apparatus as in claim 12 further comprising:

a second transducer coupled to the audio circuitry; and a second sound attenuator located and tuned relative to the second transducer to attenuate second sound from the second transducer, where the second sound attenuator is an absorber configured to attenuate sound in an at least partially different second attenuation frequency band when the second sound is generated by the second transducer from the audio signals through the audio circuitry, where the different second attenuation band is at least partially in the overlap of the first and second frequency transition bands.

15. An apparatus as in claim 12 where the first sound attenuator comprises metamaterial tuned to attenuate sound from the first transducer from the audio signals through the audio filter circuitry in a first attenuation band.

16. An apparatus as in claim 15 further comprising a second sound attenuator comprising metamaterial tuned to attenuate sound from a second transducer from the audio signals through the audio filter circuitry in a second different attenuation band.

17. An apparatus as in claim 16 further comprising a third sound attenuator comprising metamaterial tuned to attenuate sound from the first transducer from the audio signals through the audio filter circuitry in a third attenuation band which is at least partially different from the first attenuation band.

18. An apparatus as in claim 12 where a majority of the attenuation frequency band is outside a passband of the low-pass filter.

19. An apparatus as in claim 14 where the first and second sound attenuators are configured to smooth overall frequency response of the first and second transducers at the overlap of the first and second frequency transition bands.

20. A method comprising:

providing audio circuitry comprising a low-pass filter and a high-pass filter, where the low-pass filter comprises a first frequency transition band, where the high-pass filter comprises a second frequency transition band, and where the first and second frequency transition bands at least partially overlap;

coupling the audio circuitry to a first transducer; and locating a first sound attenuator relative to the first transducer to attenuate sound from the first transducer, where the first sound attenuator is an absorber configured to attenuate the sound at a frequency in the overlap of the first and second frequency transition bands.

* * * * *